United States Patent

Morozumi et al.

[11] Patent Number: 5,708,403
[45] Date of Patent: Jan. 13, 1998

[54] SAW RESONATOR HAVING TRANSVERSE MODE RIPPLE AT ANTIRESONANCE POINT

[75] Inventors: Kazuhiko Morozumi, Ishikawa-ken; Michio Kadota, Kyoto, both of Japan

[73] Assignee: Murata Manufacturing Co., Ltd., Kyoto-fu, Japan

[21] Appl. No.: 609,502

[22] Filed: Mar. 1, 1996

[30] Foreign Application Priority Data

Mar. 3, 1995 [JP] Japan ................... 7-044216

[51] Int. Cl.$^6$ .................................................. H03H 9/64
[52] U.S. Cl. ................................. 333/194; 310/313 C
[58] Field of Search ............................ 333/193–196; 310/313 R, 313 B, 313 C, 313 D

[56] References Cited

U.S. PATENT DOCUMENTS 5,204,575  4/1993  Kanda et al. .................. 333/195
5,260,913  11/1993 Kadota et al. .................. 333/193
5,471,178  11/1995 Hickernell ..................... 333/193

*Primary Examiner*—Benny Lee
*Assistant Examiner*—Darius Gambino
*Attorney, Agent, or Firm*—Ostrolenk, Faber, Gerb & Soffen, LLP

[57] ABSTRACT

A SAW resonator for forming a frequency trap has a surface wave substrate and at least one interdigital transducer located on the surface wave substrate. The interdigital transducer includes a pair of comb-shaped electrodes each having a plurality of electrode fingers arranged so that the pair of comb-shaped electrodes interdigitates with each other. An overlapping width of the electrode fingers of the interdigital transducer is set such that in an impedance-frequency characteristic a transverse mode ripple occurring between a resonance point and an antiresonance point is located at the antiresonance point.

5 Claims, 8 Drawing Sheets

F I G. 15
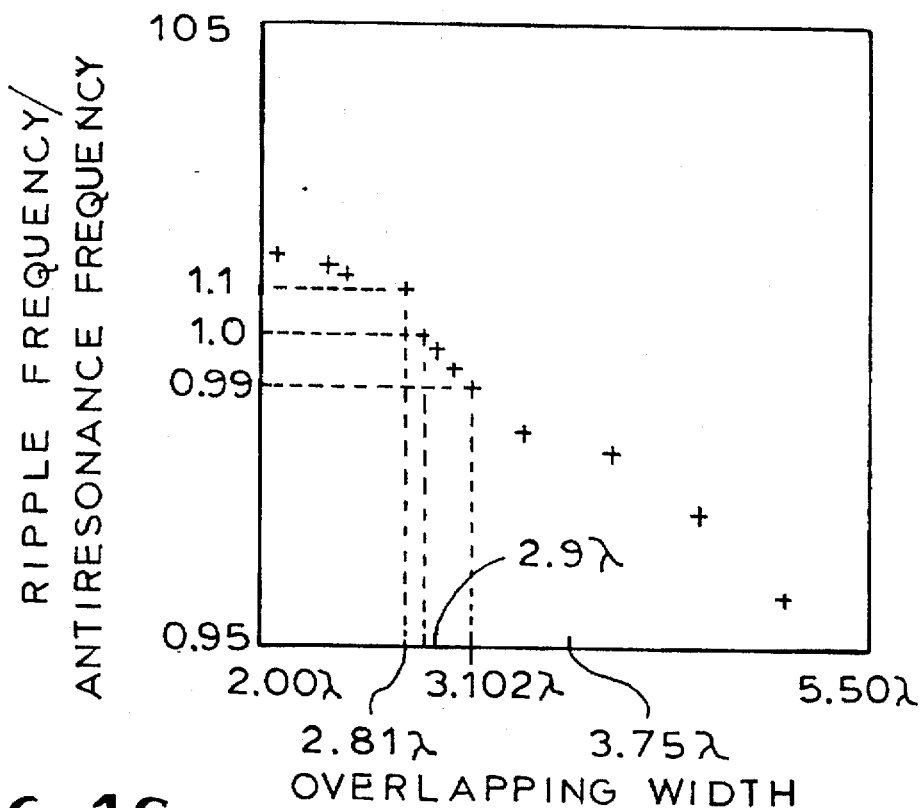
F I G. 16
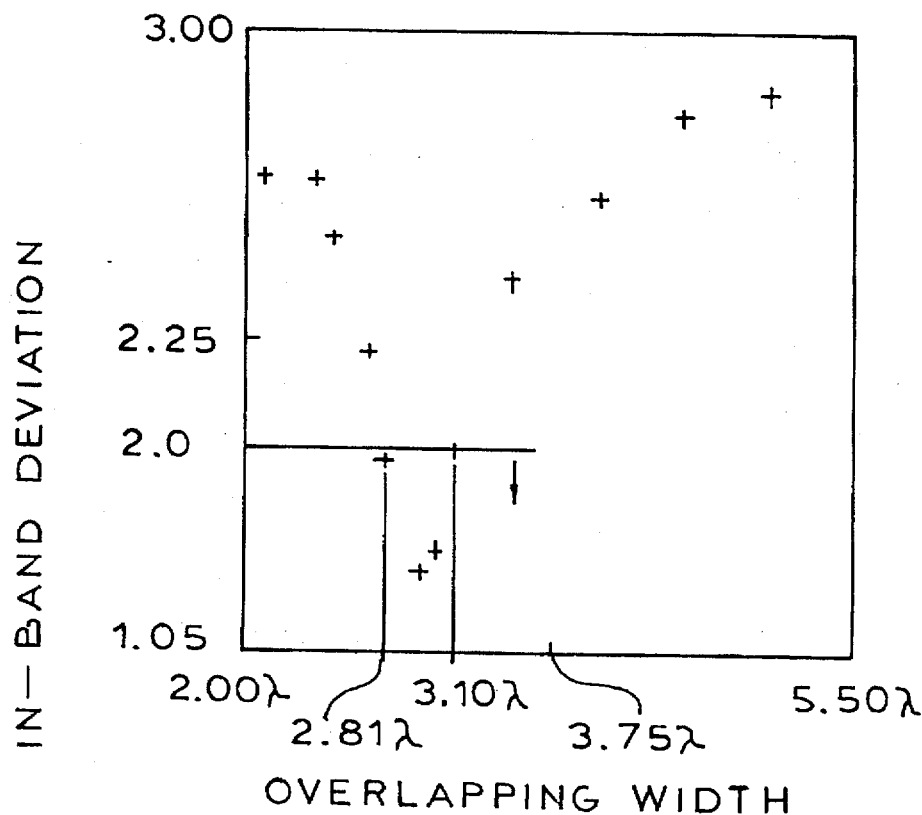

SAW RESONATOR HAVING TRANSVERSE MODE RIPPLE AT ANTIRESONANCE POINT

BACKGROUND OF THE INVENTION

1. Field of the Invention

The present invention relates to a SAW resonator for forming a frequency trap used, for example, in a picture intermediate frequency stage of a television receiver or a video tape recorder, and particularly to a SAW resonator having an improved electrode structure which provides improved transmission characteristics.

2. Description of the Related Art

In a picture intermediate frequency stage of a television receiver or a video tape recorder, a frequency trap is used to prevent beat interference with adjacent channels. As a device for providing this kind of frequency trap, conventionally, a SAW (surface acoustic wave) resonator 1 of the kind shown in FIG. 1 is used. The SAW resonator 1 comprises a surface wave substrate 2. A pair of comb-shaped electrodes 3, 4 are located on the surface wave substrate 2, and the comb-shaped electrodes 3, 4 are respectively connected to terminal electrodes 6, 7. A plurality of electrode fingers 3a of the comb-shaped electrode 3 and a plurality of electrode fingers 4a of the comb-shaped electrode 4 are disposed so as to be inserted between each other, whereby the comb-shaped electrodes 3, 4 constitute an interdigital transducer (hereinafter referred to as an IDT).

In the SAW resonator 1, by applying an alternating current voltage across the terminal electrodes 6, 7, surface waves are excited in the areas where the electrode fingers 3a and 4a overlap. The surface waves are propagated in a direction orthogonal to the direction in which the electrode fingers extend. As a result of the resonance of these surface waves, a resonance characteristic shown in FIG. 2 is obtained.

FIG. 2 shows an impedance-frequency characteristic of the SAW resonator 1. As shown in FIG. 2, the impedance of the SAW resonator 1 has a minimum value at a resonance frequency fr and has a maximum value at an antiresonance frequency fa. In forming the abovementioned frequency trap, attenuation at a trap frequency is obtained by making the resonance frequency fr of the SAW resonator 1 coincide with the trap frequency.

FIG. 3 is a graph showing a filter characteristic of a picture intermediate frequency stage of a television receiver in which the SAW resonator 1 described above is used. Here, in the attenuation-frequency characteristic curve, there are attenuation extremes at an adjacent channel picture signal frequency $f_{ap}$ and an adjacent channel sound signal frequency $f_{as}$. That is, in order to prevent beat interference with adjacent channels, the attenuation at the adjacent channel picture signal frequency $f_{ap}$ and at the adjacent channel sound signal frequency $f_{as}$ is made large. This adjacent channel picture signal frequency $f_{ap}$ differs depending on the television broadcast standard, but, for example, in the American NTSC system $f_{ap}$=39.75 MHz, $f_{as}$=47.25 MHz and in the PAL system fap=31.90 MHz and fas=40.40 MHz.

The SAW resonator 1 described above is used to make the attenuation at the adjacent channel picture signal frequency $f_{ap}$ and the adjacent channel sound signal frequency $f_{as}$ sufficiently large, i.e. to increase the attenuation at the attenuation extremes shown in FIG. 3.

Specifically, the SAW resonator 1 is used with the resonance point fr thereof made to coincide with the abovementioned adjacent channel picture signal frequency $f_{ap}$ or adjacent channel sound signal frequency $f_{as}$. However, in the SAW resonator 1, a ripple originating in a transverse mode, marked with an arrow A in FIG. 2, occurs between the resonance point fr and the antiresonance point fa. This ripple originating in a transverse mode impairs the signal transmission characteristics at frequencies other than the resonance point fr, i.e. the trap frequency. Because of this, conventionally, the SAW resonator 1 has been designed so that the transverse mode ripple is made as small as possible.

Also, constituting a greater problem than the ripple originating in a transverse mode is the amount of attenuation at the antiresonance point fa. That is, the impedance of the SAW resonator 1 is a maximum at the antiresonance point fa. As a result, when the resonance point fr is made to coincide with a trap frequency to obtain attenuation at the trap frequency, because the antiresonance frequency fa is located in a frequency region where flatness is required, there has been the problem that the transmission characteristics are impaired.

There have been various methods developed to prevent the transmission characteristics on the high-frequency side of the trap frequency from degrading because of the existence of the antiresonance point fa and the ripple originating in a transverse mode when the resonance point fr is made to coincide with a trap frequency. These methods include (1) connecting a resistor to the output side of the SAW resonator 1 to thereby damp disturbance in the transmission characteristics caused by the antiresonance point fa and the ripple originating in a transverse mode, or (2) making the resistance on the input side of the SAW resonator 1 small to thereby reduce attenuation of the trap by the SAW resonator over the entire frequency range.

For example, in the measuring circuit shown in FIG. 4, disturbance in the transmission characteristics on the high-frequency side of the trap frequency has been suppressed by connecting a resistor 8 to the output side of the SAW resonator 1 or by connecting a resistor 9 to the input side of the SAW resonator 1.

In FIG. 4, reference numeral 10 indicates an alternating current source and reference numeral 11 indicates a voltmeter. Resistances 12 and 15 denote characteristic impedances of the measuring circuit, resistors 13 and 14 are provided for adjusting the voltage supplied to the SAW resonator 1 and the output voltage, and the output side resistor 8 or the input side resistor 9 has been connected in addition to these resistors normally used.

However, with the construction of method (1) wherein the resistor 8 is connected to the output side, although it is possible to suppress disturbance of the transmission characteristics, there has been the problem that the signal level falls. Also, with method (2) wherein the resistor 9 is connected to the input side, because the trap effect itself becomes small, it is not possible to form a trap capable of providing sufficient attenuation.

SUMMARY OF THE INVENTION

The preferred embodiments of the present invention solve the aforementioned problems associated with the related art and provide a SAW resonator having good transmission characteristics on the high-frequency side of a trap frequency without reducing the signal level or trap effect.

According to the preferred embodiments of the invention, there is provided a SAW resonator for forming a frequency trap having a surface wave substrate and at least one IDT located on the surface wave substrate, wherein the overlapping width of electrode fingers of the IDT is set so that in an impedance-frequency characteristic curve, a ripple originating in a transverse mode occurring between a resonance point and an antiresonance point is located at the antiresonance point.

Also, in setting the overlapping width of electrode fingers of the IDT so that in the abovementioned impedance-frequency characteristic curve a ripple originating in a transverse mode occurring between a resonance point and an antiresonance point is located at the antiresonance point, preferably, the overlapping width is made to be within the range of about 2.8 λ to 3.1 λ, where λ is the wavelength of surface waves excited.

In cases wherein weighting of the overlapping width has been carried out, the maximum overlapping width should preferably be within the range of about 2.8 λ to 3.1 λ.

Conventionally, because the transverse mode ripple between the resonance point fr and the antiresonance point fa of a SAW resonator disturbs the transmission characteristics, the conventional methods described above have been used to reduce the transverse mode ripple. In contrast with this, in the preferred embodiments of the present invention, disturbance of the transmission characteristics at the antiresonance point is suppressed by moving the location of the frequency at which the transverse mode ripple occurs so as to be positioned at the antiresonance point.

In the preferred embodiments of the present invention, the location at which the transverse mode ripple occurs is controlled by adjusting the overlapping width of the electrode fingers. That is, the present inventors have discovered that the transverse mode ripple changes with the overlapping width of the electrode fingers of the IDT. Based on this newly discovered knowledge, in the preferred embodiments of the present invention, the overlapping width of the electrode fingers is determined such that the location at which the transverse mode ripple occurs is located at the antiresonance point.

Also, in a preferred embodiment of the invention, the overlapping width is arranged to be within the range of about 2.8 λ to 3.1 λ, where λ is the wavelength of surface waves excited on a surface wave substrate. The preferred range of overlapping width discussed above was determined after setting the overlapping width in the above-mentioned preferred range and determining that the transverse mode ripple can be made to be positioned at the antiresonance point.

Thus, according to the preferred embodiments of the present invention, by adjusting the overlapping width of the electrode fingers of the IDT, the ripple originating in a transverse mode is made to be located at the antiresonance point. Consequently, it is possible to effectively prevent deterioration of the transmission characteristics of the SAW resonator in the vicinity of the antiresonance point. As a result, it is possible to improve the transmission characteristics on the high-frequency side of the trap frequency. Furthermore, because it is not necessary to connect a damping resistor to the input side or the output side of the SAW resonator, deterioration of the signal level or the trap effect does not readily occur.

Therefore, the preferred embodiments of the present invention provide a SAW resonator highly suitable for use in a trap circuit in a picture intermediate frequency stage of a television receiver or a video tape recorder.

For the purpose of illustrating the invention, there is shown in the drawings several forms which are presently preferred, it being understood, however, that the invention is not limited to the precise arrangements and instrumentalities shown.

BRIEF DESCRIPTION OF THE DRAWINGS

FIG. 15 is a graph showing a relationship between an overlapping width of electrode fingers and the frequency of a ripple originating in a transverse mode and an antiresonance frequency; and FIG. 16 is a graph showing a relationship between an overlapping width of electrode fingers and an in-band deviation.

DETAILED DESCRIPTION OF PREFERRED EMBODIMENTS

Hereinafter, the preferred embodiments of the present invention are explained in detail with reference to the drawings.

Figure 1:
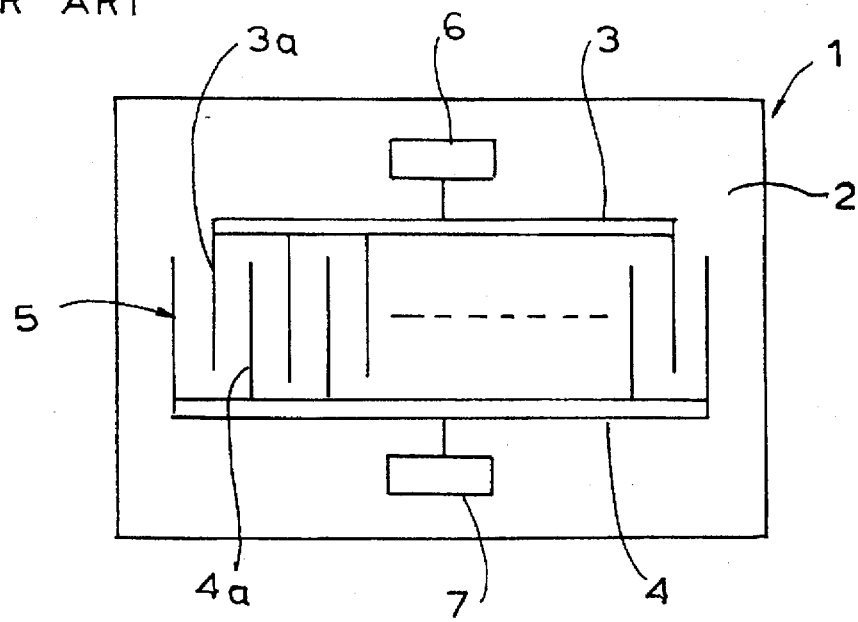
FIG. 1 is a schematic plan view illustrating a conventional SAW resonator.
Figure 2:
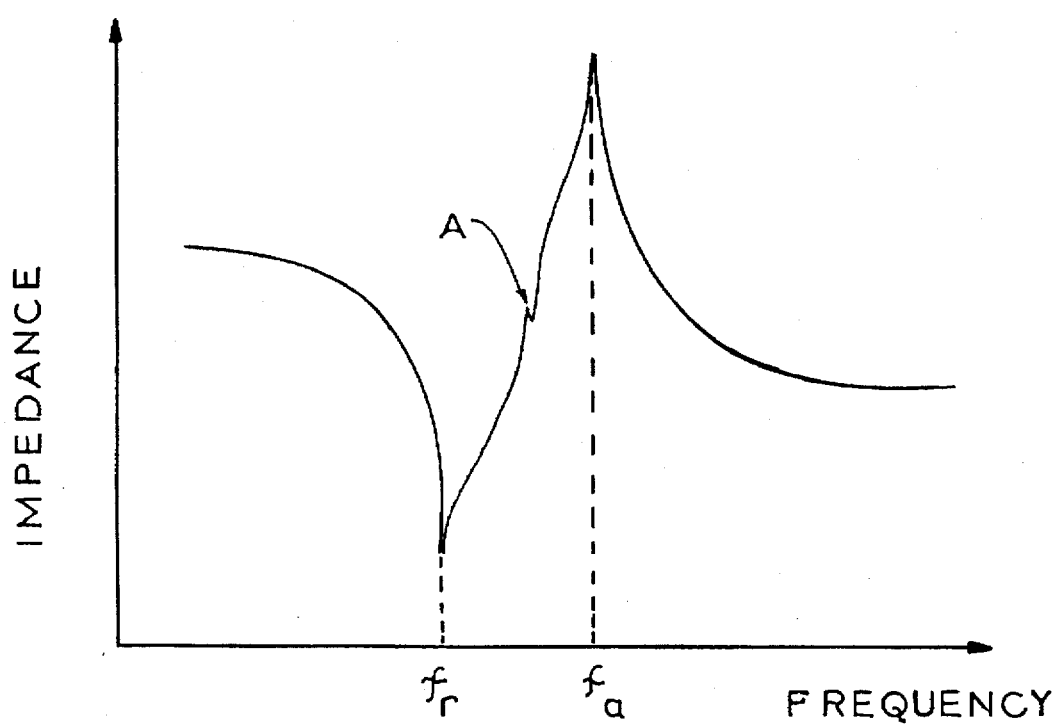
FIG. 2 is a graph showing an impedance-frequency characteristic of a conventional SAW resonator.
Figure 3:
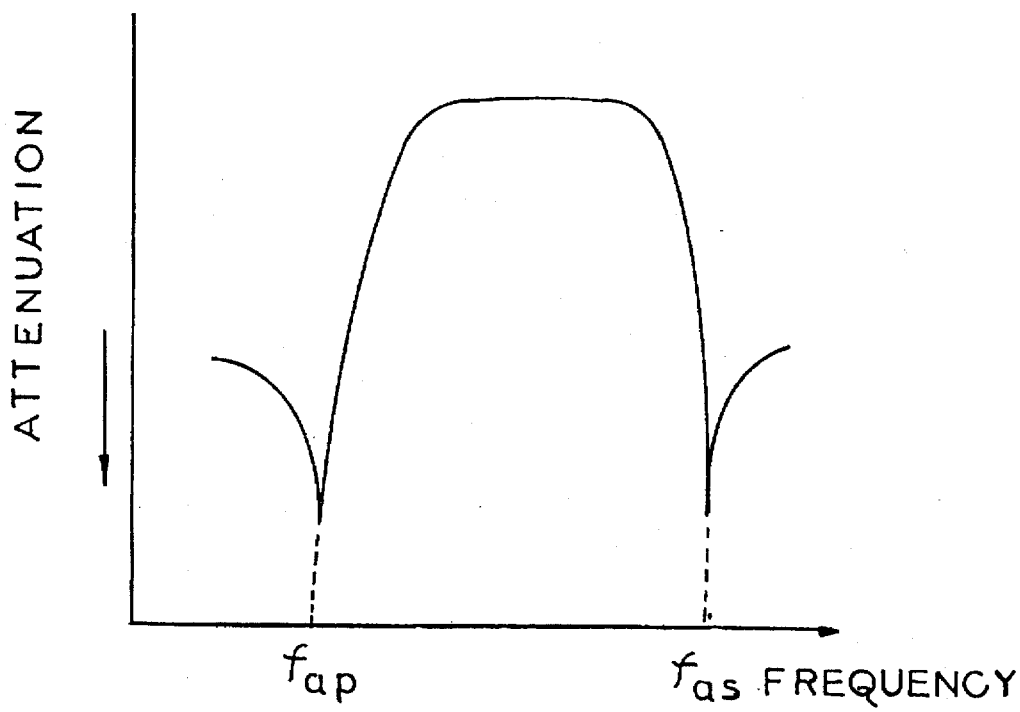
FIG. 3 is a graph showing an attenuation-frequency characteristics of a picture intermediate frequency stage of a television receiver.
Figure 4:
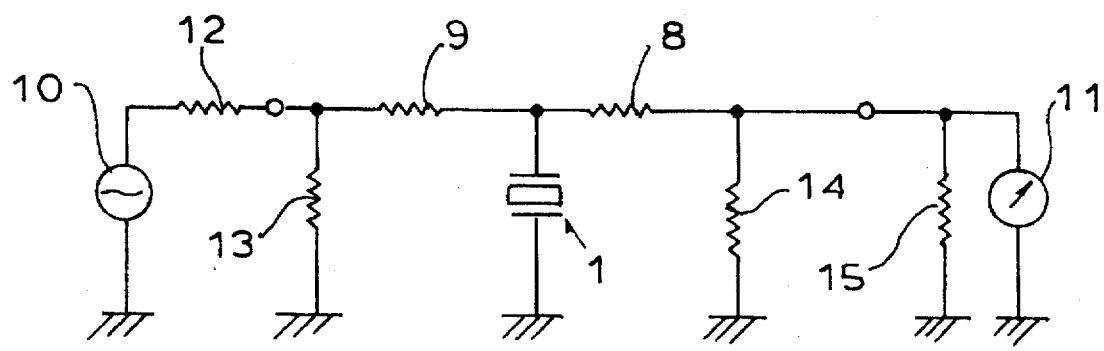
FIG. 4 is a diagram illustrating a circuit for measuring characteristics of a conventional SAW resonator with resistors connected to the input side and the output side thereof.
Figure 5:
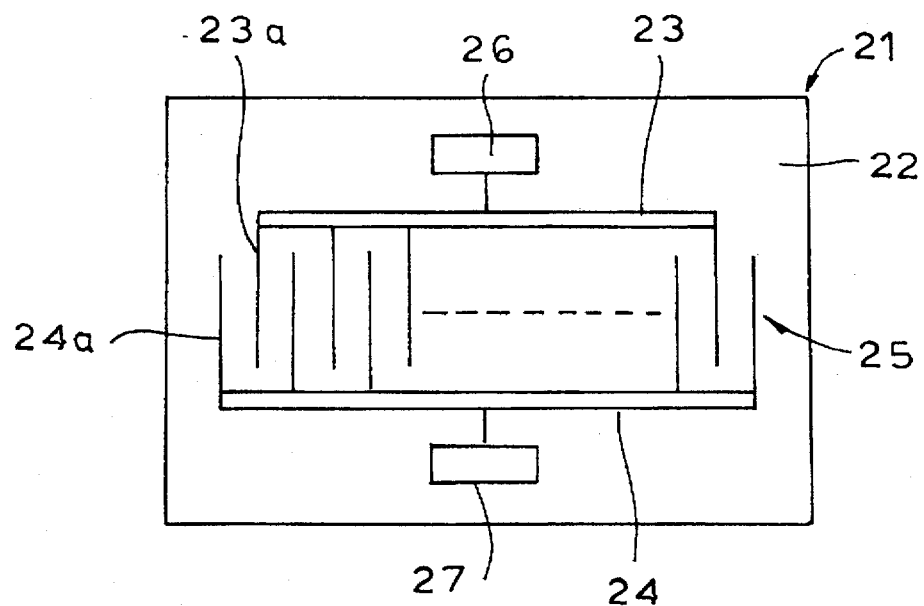
FIG. 5 is a schematic plan view illustrating an example of a SAW resonator according to a preferred embodiment of the invention.

FIG. 5 is a schematic plan view illustrating a SAW resonator according to a preferred embodiment of the invention. The SAW resonator 21 comprises a surface wave substrate 22. The surface wave substrate 22 can be made using a piezoelectric monocrystalline substrate of LiNbO₃, LiTaO₃ or quartz crystal or the like or a piezoelectric ceramic plate including a piezoelectric ceramic such as titanate zirconate. Alternatively, the surface wave substrate 22 may be made by forming a piezoelectric thin film of ZnO or the like on an insulating substrate made of alumina, for example.

Comb-shaped electrodes 23, 24 are located on the upper surface of the surface wave substrate 22 and electrically connected to terminal electrodes 26, 27, respectively. These comb-shaped electrodes 23, 24 constitute an IDT 25. The comb-shaped electrodes 23, 24 have pluralities of electrode fingers 23a, 24a, respectively. The plurality of electrode fingers 23a and the plurality of electrode fingers 24a are disposed so as to be inserted between each other.

The comb-shaped electrodes 23, 24 and the terminal electrodes 26, 27 can be made of any suitable metal material such as aluminum or Au, for example. Also, the comb-shaped electrodes 23, 24 and the terminal electrodes 26, 27 may be located on the upper surface of the surface wave substrate 22. Alternatively, when a surface wave substrate made by forming a piezoelectric thin film on an insulating substrate is used, the comb-shaped electrodes 23, 24 and the terminal electrodes 26, 27 may be located between the insulating substrate and the piezoelectric thin film.

Figure 6:
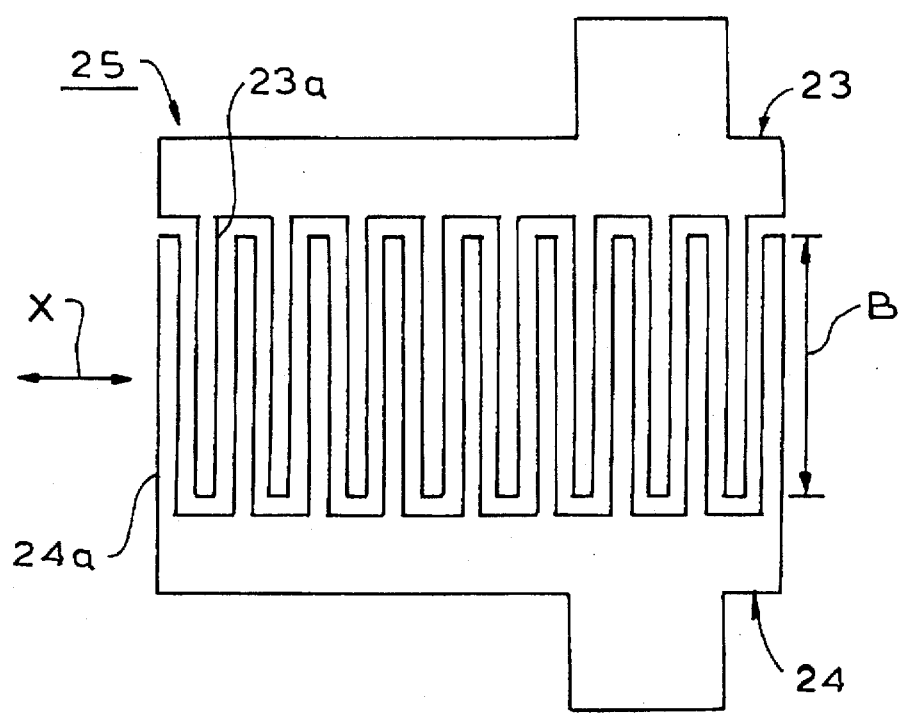
FIG. 6 is a schematic plan view illustrating details of an IDT shown in FIG. 5.

The IDT 25 including the comb-shaped electrodes 23, 24 shown schematically in FIG. 5 is shown enlarged in FIG. 6. The plurality of electrode fingers 23a of the comb-shaped electrode 23 and the plurality of electrode fingers 24a of the comb-shaped electrode 24 are preferably all of equal length. The overlapping width B of the electrode fingers 23a and the adjacent electrode fingers 24a is preferably constant throughout the IDT 25. That is, the IDT 25 is preferably a regular IDT wherein the pluralities of electrode fingers 23a and 24a are disposed so as to have a constant overlapping width.

A characteristic feature of the preferred embodiments of the present invention lies in that the above-mentioned overlapping width, that is, the width B by which adjacent electrode fingers 23a, 24a overlap in the surface wave propagation direction X, is set such that the ripple originating in a transverse mode between the resonance point and the antiresonance point in the impedance-frequency characteristic is located at the antiresonance point. This will now be explained using as an example the case of forming an adjacent channel picture signal frequency $f_{ap}$ trap of a picture intermediate frequency stage of an NTSC system television receiver based on specific experimental results.

In a picture intermediate frequency stage of an NTSC system television receiver, a sound frequency of a television channel is 41.25 MHz, a color signal frequency of the television channel is 42.17 MHz and a picture signal frequency of the television channel is 45.75 MHz. On the other hand, a sound signal frequency $f_{as}$ of an adjacent channel is 47.25 MHz and a picture signal frequency $f_{ap}$, of another adjacent channel is 39.75 MHz. Therefore, flat transmission characteristics are required in the range from 41.25 MHz to 45.75 MHz, and an in-band attenuation deviation in this frequency range of 1.5 dB or less is necessary.

The present inventors prepared four SAW resonators having different electrode finger overlapping widths B as the SAW resonator 21 having the IDT 25 shown in FIG. 6 and measured the impedance-frequency characteristic and attenuation-frequency characteristic of each.

The specifications of the four SAW resonators prepared are now described. A surface wave substrate 22 made of a piezoelectric ceramic and having the dimensions 1.07× 0.80×0.50 mm was used and an IDT 25 made of aluminum was formed. The IDT 25 formed had 18 pairs of electrode fingers.

The overlapping width of the electrode fingers was made to be equal to 2.4 λ in the first SAW resonator, 2.9 λ in the second SAW resonator, 3.4 λ in the third SAW resonator and 3.8 λ in the fourth SAW resonator.

Figure 7:
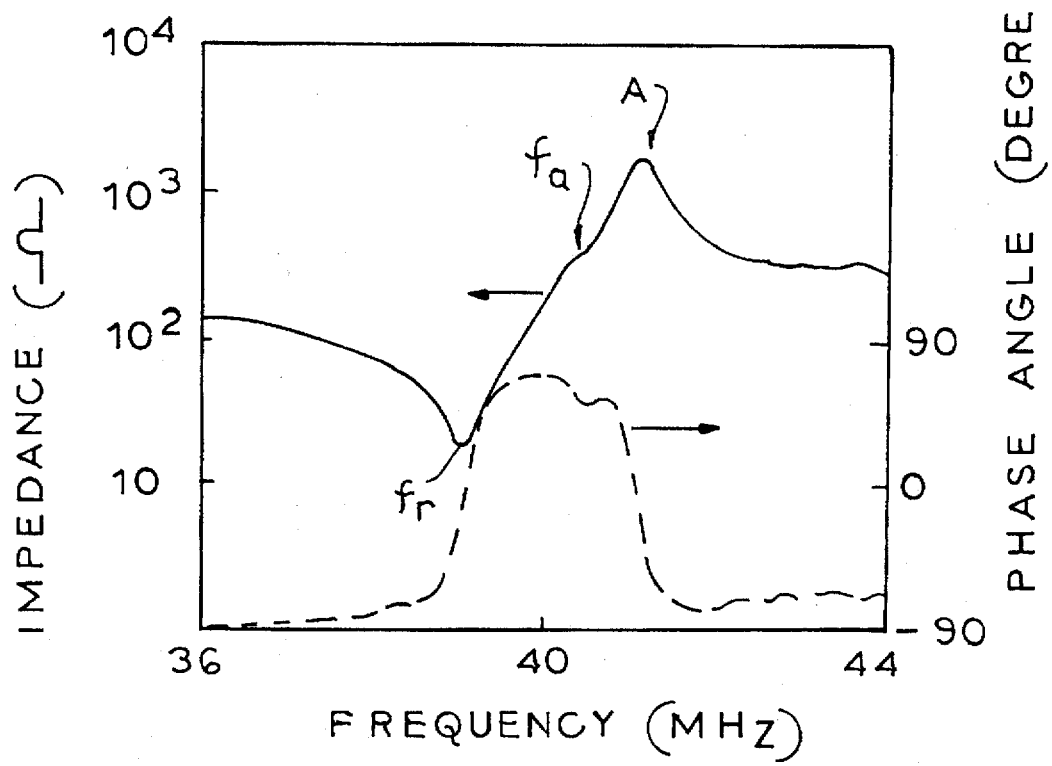
FIG. 7 is a graph showing an impedance-frequency characteristic and a phase-frequency characteristic of a first SAW resonator.
Figure 8:
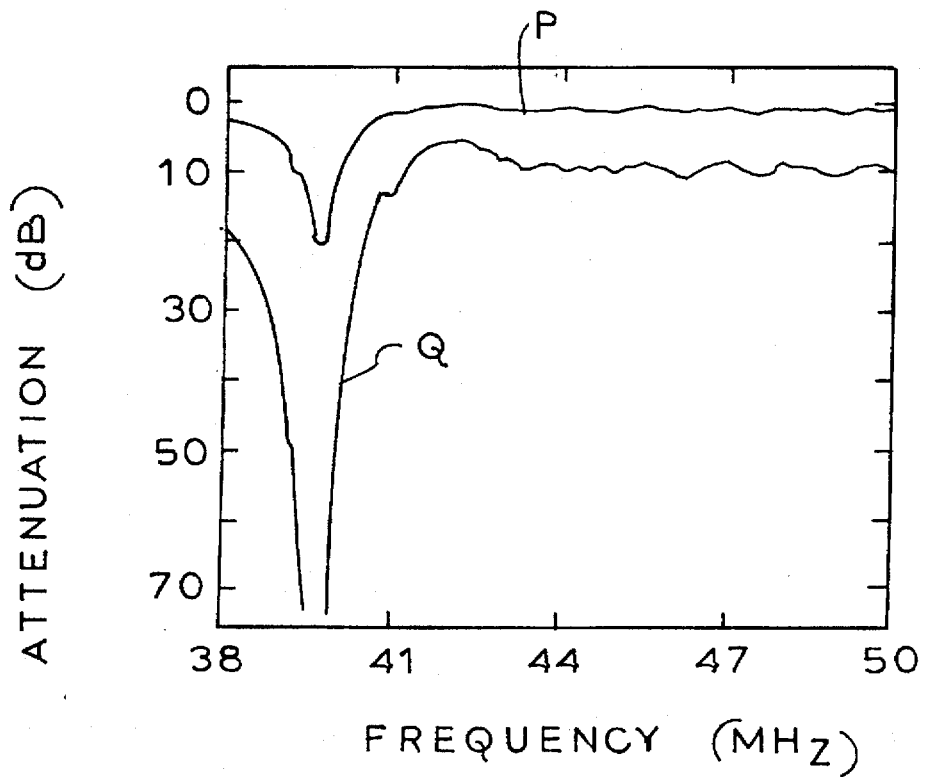
FIG. 8 is a graph showing an attenuation-frequency characteristic of the first SAW resonator.
Figure 10:
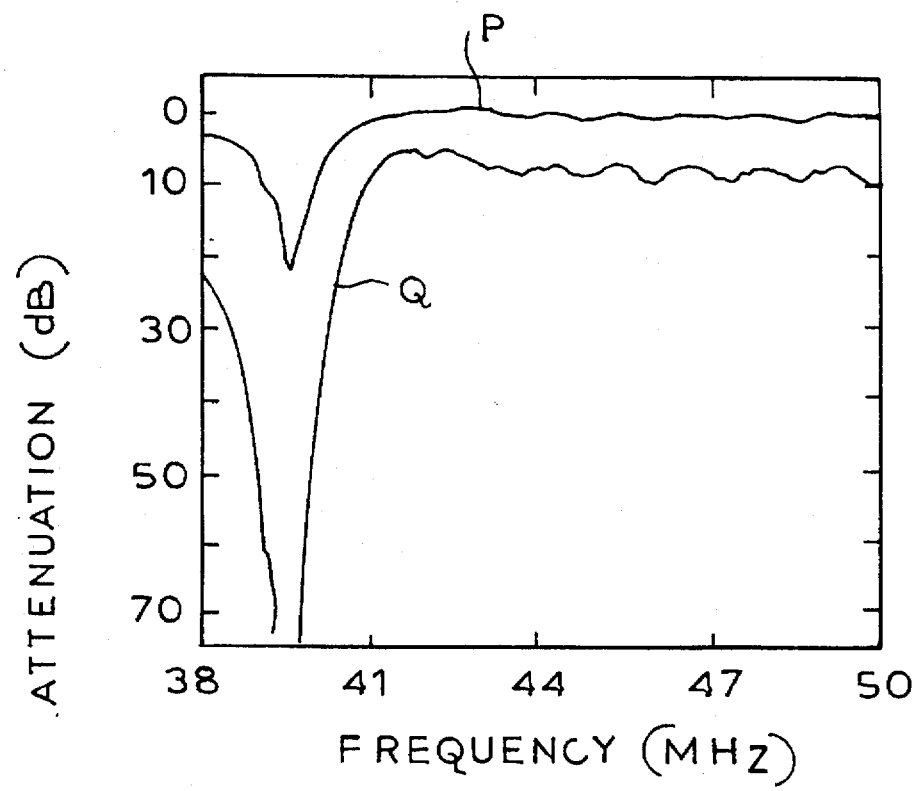
FIG. 10 is a graph showing an attenuation-frequency characteristic of the second SAW resonator.
Figure 11:
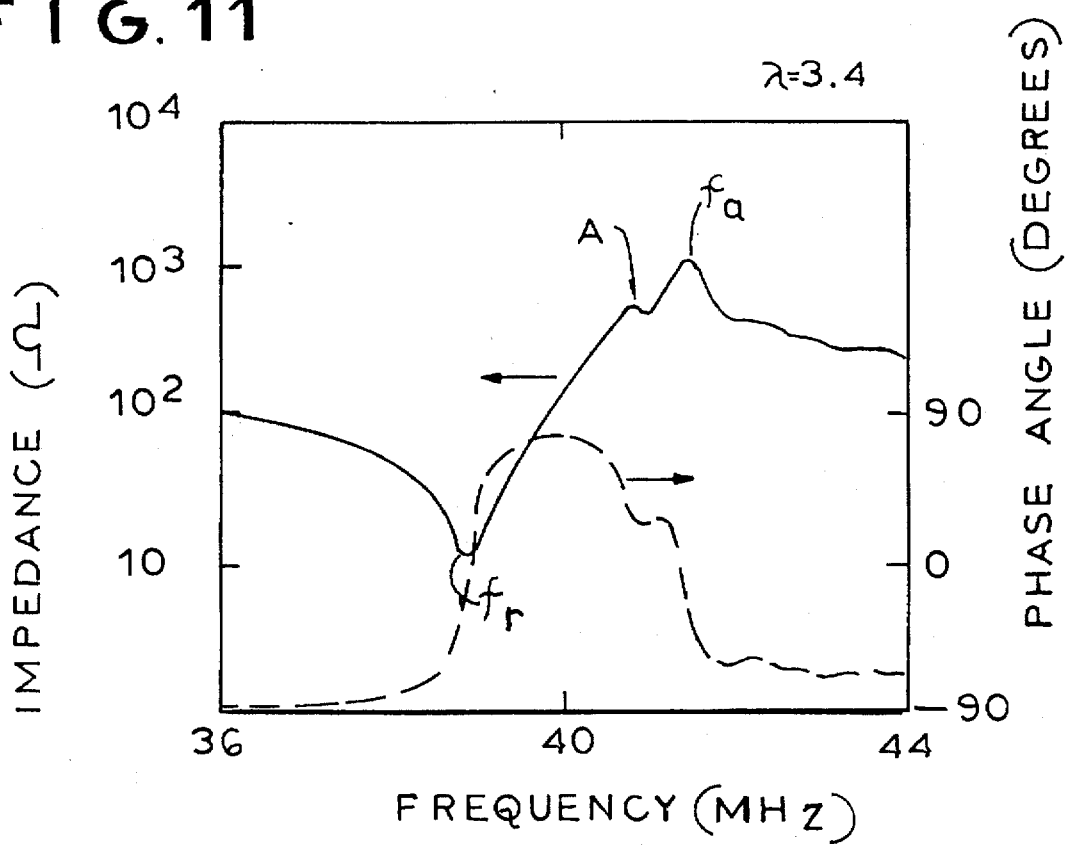
FIG. 11 is a graph showing an impedance-frequency characteristic and a phase-frequency characteristic of a third SAW resonator.
Figure 12:
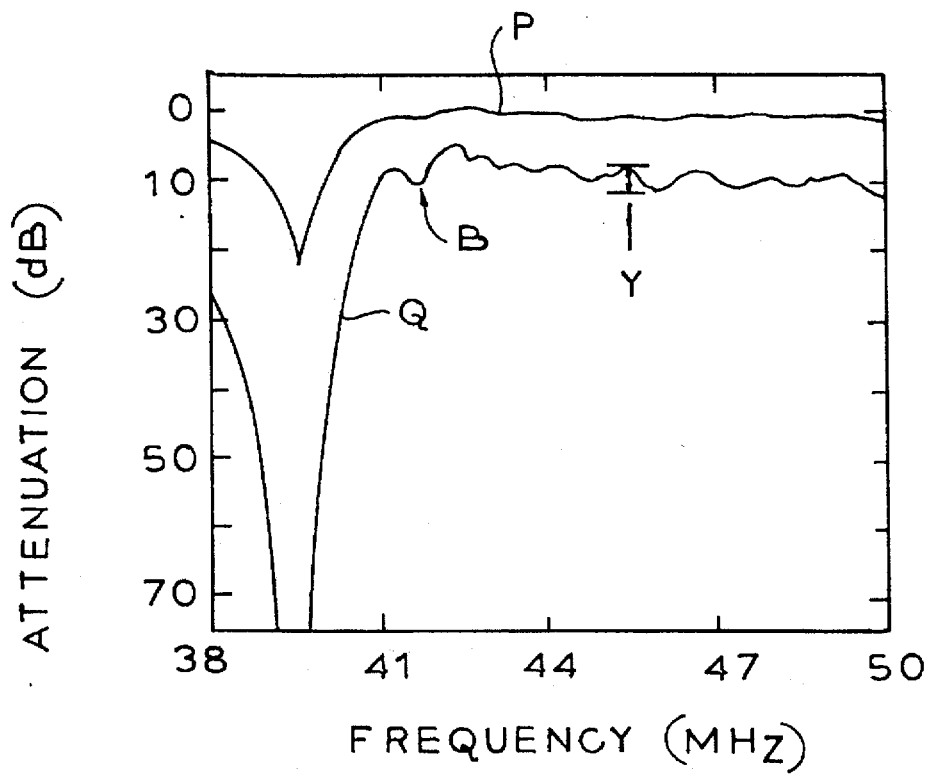
FIG. 12 is a graph showing an impedance-frequency characteristic of the third SAW resonator.
Figure 13:
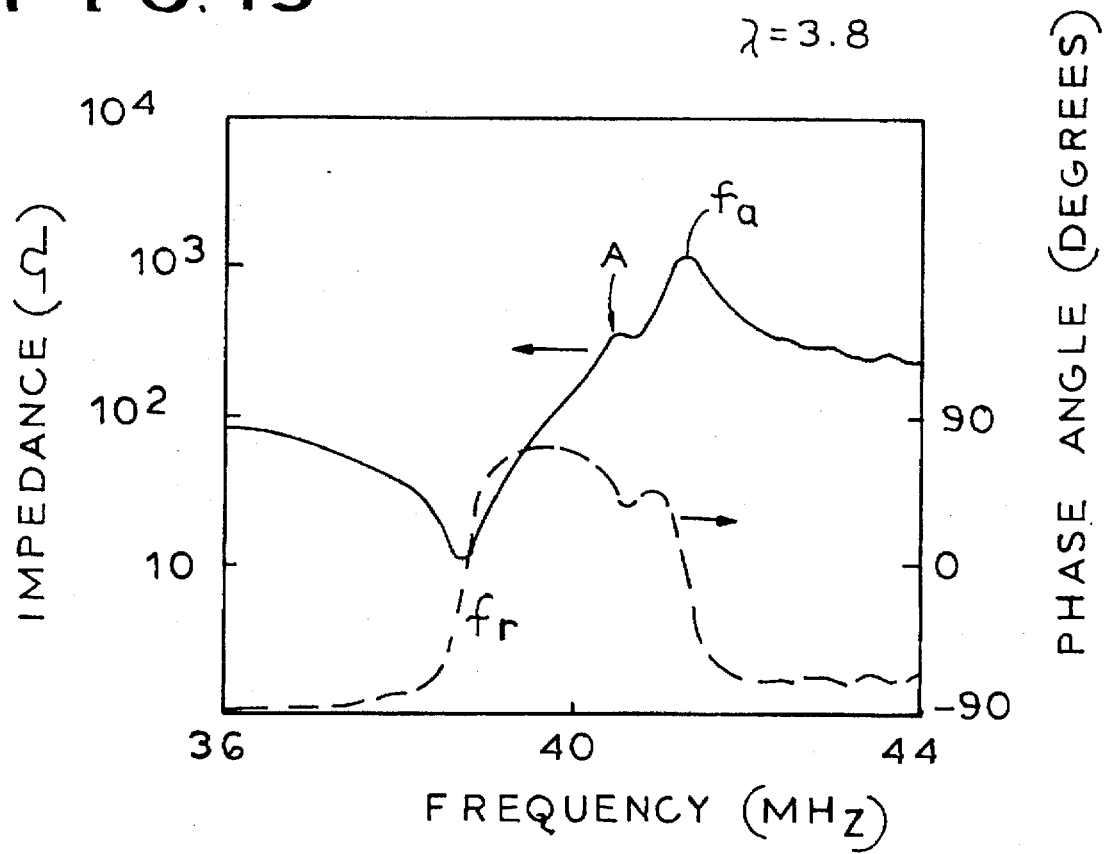
FIG. 13 is a graph showing an impedance-frequency characteristic and a phase-frequency characteristic of a fourth SAW resonator.
Figure 14:
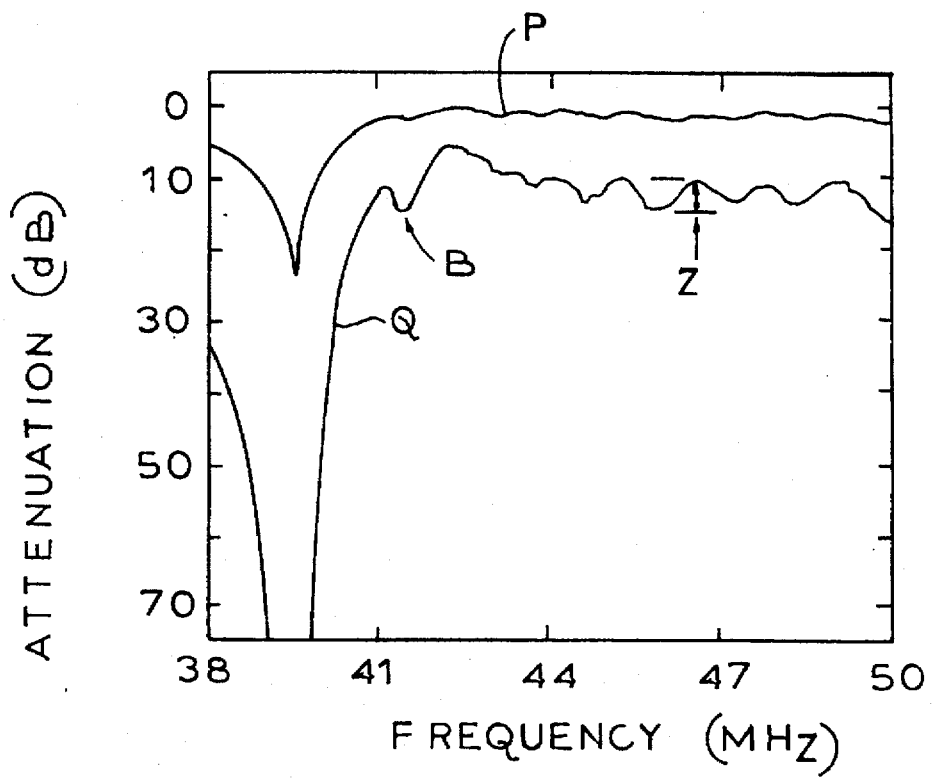
FIG. 14 is a graph showing an attenuation-frequency characteristic of the fourth SAW resonator.

The impedance-frequency characteristic and the phase-frequency characteristic of the first SAW resonator are shown in FIG. 7 and the attenuation-frequency characteristic of the first SAW resonator is shown in FIG. 8. Similarly, the impedance-frequency characteristics and the phase-frequency characteristics of the second to fourth SAW resonators are respectively shown in FIG. 9, FIG. 11 and FIG. 13 and the attenuation-frequency characteristics of the second to fourth SAW resonators are respectively shown in FIG. 10, FIG. 12 and FIG. 14.

In FIG. 8, FIG. 10, FIG. 12 and FIG. 14, the solid lines Q are enlarged views of the attenuation-frequency characteristics shown with the solid lines P, and show the attenuation characteristics as they would appear on scales five times as large as those shown in the drawings.

The trap frequency of the first to fourth SAW resonators is set to be 39.75 MHz, as discussed above. In the case, the excited surface wave wavelength 1 is 59.38 μm.

As is clear from FIG. 7, in the first SAW resonator, the extreme of the impedance value at the antiresonance point fa is not suppressed much. Consequently, as is clear from FIG. 8, the attenuation in the vicinity of the antiresonance point fa is smaller than the attenuation on the high-frequency side of the antiresonance point fa. That is, deviation in the transmission characteristics on the high-frequency side of the trap frequency is considerably large.

Figure 9:
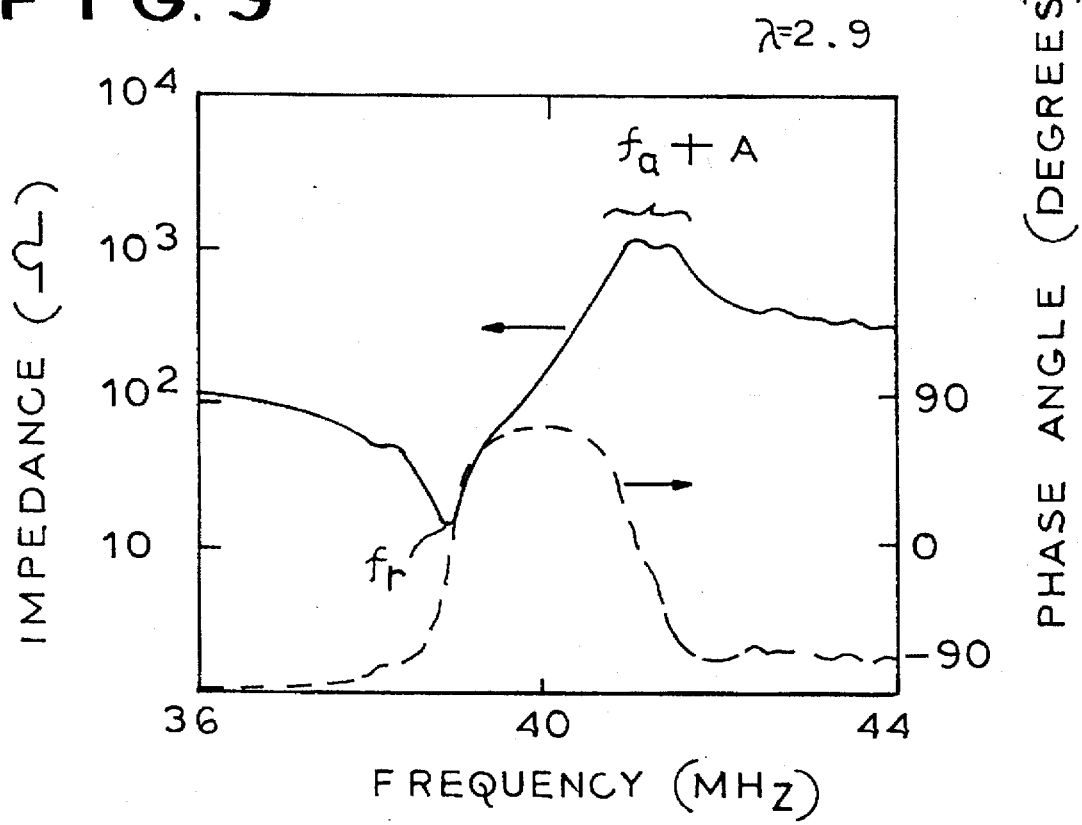
FIG. 9 is a graph showing an impedance-frequency characteristic and a phase-frequency characteristic of a second SAW resonator according to a preferred embodiment of the invention.

With respect to this, in the second SAW resonator, as is clear from FIG. 9, the maximum point of the impedance at the antiresonance point fa is suppressed. Consequently, as is clear from FIG. 10, the attenuation is substantially flat on the high-frequency side of the trap frequency.

Also, as is clear from FIG. 11 to FIG. 14, in the third and fourth SAW resonators, the transverse mode ripple shown by the arrow A appears near the antiresonance point but separately from the antiresonance point. Consequently, the attenuation in the vicinity of the sound signal frequency of the television channel (41.25 MHz shown by the arrow B) is greater than at higher frequencies and also disturbance of the transmission characteristics in the vicinity of the antiresonance point occurs as shown by the arrows Y and Z in FIG. 12 and FIG. 14.

Therefore, as is clear from FIG. 7 to FIG. 14, by adjusting the overlapping width of the electrode fingers it is possible to flatten the transmission characteristics on the high-frequency side of the trap frequency and it is possible to move the location at which the transverse mode ripple occurs.

Accordingly, the present inventors conducted experiments in which they changed the overlapping width of the electrode fingers of the SAW resonator more finely to find out what overlapping width of the electrode fingers makes it possible to make the transverse mode ripple be located at the antiresonance point and realize flattening of the transmission characteristics on the high-frequency side of the trap frequency. The results are shown in FIG. 15 and FIG. 16.

FIG. 15 is a graph showing with the symbol "+" a relationship thus obtained between the overlapping width of the electrode fingers and the ratio of the frequency of the ripple originating in a transverse mode to the antiresonance frequency. In FIG. 15, the graduation 1.0 shows a case wherein the transverse mode ripple coincides exactly with the antiresonance point. As shown in FIG. 15, the overlapping width of about 2.9 λ gives the ratio of 1.0. FIG. 16 shows the relationship between the overlapping width of the electrode fingers and the in-band deviation, i.e. the difference between the maximum value and the minimum value of the attenuation within the band used for the picture signal frequency of the television channel, the color signal frequency of the television channel and the sound signal frequency of the television channel.

As described above, it is required that this in-band deviation be less than 2.0 dB. As is clear from FIG. 16, to make the in-band deviation less than 2.0 dB, it is necessary that the overlapping width of the electrode fingers be made equal to about 2.8 λ to 3.1 λ. Also, as shown in FIG. 15, the range from about 2.8 λ to 3.1 λ of the overlapping width corresponds to the range from about 0.99 to 1.1 of the ratio of the ripple frequency to the antiresonance frequency. Therefore, in the above-mentioned SAW resonator, by making the overlapping width of the electrode fingers within the range specified above, in other words, by setting overlapping width so that in an impedance-frequency characteristic the transverse mode ripple is located at the antiresonance point, it is possible to make the in-band deviation less than 2.0 dB. As a result, it is possible to improve the transmission characteristics in the band used for the television channel on the high-frequency side of the trap frequency.

As is explained above, FIG. 9 shows an impedance-frequency characteristic and a phase-frequency characteristic in the case where the overlapping width of the electrode fingers is set to be 2.9 λ. In this case, the frequency of the ripple originating in a transverse mode is substantially identical to the antiresonance frequency. Therefore, a peak which represents the antiresonance frequency is made round and reduced. This means that only the impedance at the antiresonance frequency can be decreased while an impedance at the resonance frequency remains unchanged. Thus, the impedance-frequency characteristic curve on the high-frequency side of the trap frequency is flattened without reducing the signal level or trap effect. That is, the transmission characteristics on the high-frequency side of the trap frequency is improved without degrading the trap characteristics at the trap frequency.

Also, with the SAW resonator of this preferred embodiment, there is no particular need to connect a resistor for damping on the input side or the output side of the SAW resonator. As a result, decreasing of the signal level and changing of the trap effect do not readily occur.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A SAW resonator comprising:

a surface wave substrate;

at least one interdigital transducer located on the surface wave substrate, the interdigital transducer including a pair of comb-shaped electrodes each having a plurality of electrode fingers arranged so that the pair of comb-shaped electrodes interdigitates with each other; wherein an overlapping width of the electrode fingers of the interdigital transducer causes a transverse mode ripple, occurring between or adjacent to a resonance point and an antiresonance point, to be located substantially at the antiresonance point in such a manner that a peak point of the antiresonance point is dulled.

2. A SAW resonator according to claim 1, wherein the overlapping width is in a range from about 2.8 λ to 3.1 λ, where λ is a wavelength of a surface acoustic wave excited on the surface wave substrate.

3. A SAW resonator according to claim 1, wherein an impedance of the SAW resonator has a minimum value at the resonance point and a maximum value at the antiresonance point.

4. A SAW resonator according to claim 1, wherein the resonance point is substantially equal to one of an adjacent channel picture signal frequency and an adjacent channel sound signal frequency of a television receiver.

5. A saw resonator according to claim 1, wherein the overlapping width of each of the electrode fingers has substantially the same value which is in a range from about 2.8 λ to 3.1 λ, where λ is a wavelength of a surface acoustic wave excited on the surface wave substrate.

* * * * *